US009886378B2

(12) United States Patent
Leem

(10) Patent No.: US 9,886,378 B2
(45) Date of Patent: Feb. 6, 2018

(54) NONVOLATILE MEMORY SYSTEM USING CONTROL SIGNALS TO TRANSMIT VARIED SIGNALS VIA DATA PINS

(71) Applicant: SAMSUNG ELECTRONICS CO., LTD., Suwon-si, Gyeonggi-Do (KR)

(72) Inventor: Hyotaek Leem, Suwon-si (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 237 days.

(21) Appl. No.: 14/556,784

(22) Filed: Dec. 1, 2014

(65) Prior Publication Data

US 2015/0310916 A1 Oct. 29, 2015

(30) Foreign Application Priority Data

Apr. 29, 2014 (KR) .................. 10-2014-0051695

(51) Int. Cl.
*G06F 12/00* (2006.01)
*G06F 12/02* (2006.01)
*G11C 7/10* (2006.01)
*G11C 7/22* (2006.01)

(52) U.S. Cl.
CPC .......... *G06F 12/0246* (2013.01); *G11C 7/109* (2013.01); *G11C 7/1066* (2013.01); *G11C 7/1093* (2013.01); *G11C 7/22* (2013.01)

(58) Field of Classification Search
CPC ......... G06F 2212/7201; G06F 12/0246; G11C 7/22; G11C 7/1093; G11C 7/109; G11C 7/1066

See application file for complete search history.

(56) References Cited

U.S. PATENT DOCUMENTS

| 7,689,763 | B2 | 3/2010 | Charles et al. |
| 7,793,031 | B2 | 9/2010 | Sartori et al. |
| 7,916,557 | B2 | 3/2011 | Abedifard |
| 7,975,096 | B2 | 7/2011 | Yang et al. |
| 7,978,516 | B2 | 7/2011 | Olbrich et al. |
| 8,028,119 | B2 | 9/2011 | Miura |
| 8,325,525 | B2 | 12/2012 | Mao et al. |
| 8,341,324 | B2 | 12/2012 | Kuo et al. |

(Continued)

OTHER PUBLICATIONS

IBM, Understanding DRAM Operation, Nov. 17, 1997, accessed Apr. 24, 2017, retrieved from the internet: https://www.ece.cmu.edu/~ece548/localcpy/dramop.pdf.*

(Continued)

*Primary Examiner* — Larry T Mackall
(74) *Attorney, Agent, or Firm* — F. Chau & Associates, LLC

(57) ABSTRACT

A nonvolatile memory system is provided. The memory system includes a nonvolatile memory device and a memory controller. The memory controller transmits first to fourth control signals to the nonvolatile memory device, sends a command, an address, and input data via a data bus, and receives output data via the data bus. The nonvolatile memory device receives the first to fourth control signals, and recognizes signals received via the data bus at a rising edge or a falling edge of the fourth control signal, as one of the command, the address, and the input data in response to the first to third control signals, and transfers the output data to the memory controller via the data bus based on the fourth control signal.

20 Claims, 15 Drawing Sheets

(56) References Cited

U.S. PATENT DOCUMENTS

| | | |
|---|---|---|
| 8,438,356 B2 | 5/2013 | Yoon et al. |
| 8,464,087 B2 | 6/2013 | Kim et al. |
| 2002/0049951 A1* | 4/2002 | Seyyedy ............. G06F 11/1044 714/777 |
| 2003/0028744 A1* | 2/2003 | Fackenthal ......... G06F 13/4243 711/200 |
| 2011/0040924 A1 | 2/2011 | Selinger |
| 2011/0173382 A1 | 7/2011 | Abedifard |
| 2013/0094271 A1 | 4/2013 | Schuetz |
| 2013/0111113 A1 | 5/2013 | Harari et al. |
| 2013/0262744 A1 | 10/2013 | Ramachandra et al. |

OTHER PUBLICATIONS

Intel Corporation, Micron Technology, Inc., Phison Electronics Corp., SanDisk Corporation, SK Hynix, Inc., Sony Corporation, Spansion, "Open NAND Flash Interface Specification", Revision 3.2 Jun. 12, 2013.

* cited by examiner

| CTRL1 (CEB) | CTRL2 (CALE) | CTRL3 (REB/CAS) | CTRL4 (DQS) | STATE |
|---|---|---|---|---|
| L | H | H | ⎤_⎛ | CMD Input |
| L | H | L | ⎤_⎛ | ADDR Input |
| L | L | H | ⎦⎛ | DATA Input |
| L | L | ⎦⎛ | ⎦⎛ | DATA Output |

FIG. 13

| MODE | CTRL1 | CTRL2 | CTRL3 | CTRL4 | CTRL5 | CTRL6 | STATE |
|---|---|---|---|---|---|---|---|
| MODE1 | L | H | H | ⎍ | X | X | CMD Input |
| MODE1 | L | H | L | ⎍ | X | X | ADDR Input |
| MODE1 | L | L | H | ⎍ | X | X | DATA_Input |
| MODE1 | L | L | ⎍ | ⎍ | X | X | DATA_Output |
| MODE2 | L | H | H | X | L | ⎍ | CMD Input |
| MODE2 | L | L | H | ⎍ | H | ⎍ | ADDR Input |
| MODE2 | L | L | H | ⎍ | L | H | DATA_Input |
| MODE2 | L | L | ⎍ | ⎍ | L | H | DATA_Output |

NONVOLATILE MEMORY SYSTEM USING CONTROL SIGNALS TO TRANSMIT VARIED SIGNALS VIA DATA PINS

CROSS-REFERENCE TO RELATED APPLICATIONS

This application claims priority under 35 U.S.C. § 119 to Korean Patent Application No. 10-2014-0051695, filed on Apr. 29, 2014, in the Korean Intellectual Property Office, the disclosure of which is incorporated by reference herein in its entirety.

TECHNICAL FIELD

The present inventive concept relates to a semiconductor memory, and more particularly, to a nonvolatile memory device and a nonvolatile memory system including a memory controller.

DISCUSSION OF THE RELATED ART

A semiconductor memory device is a memory device which is fabricated using semiconductors such as silicon (Si), germanium (Ge), gallium arsenide (GaAs), indium phosphide (InP), or the like. Semiconductor memory devices include volatile memory devices and nonvolatile memory devices.

The volatile memory devices may lose contents stored therein at power-off. The volatile memory devices include a static random-access memory (SRAM), a dynamic random-access memory (DRAM), a synchronous DRAM (SDRAM), or the like. The nonvolatile memory devices may retain stored contents even at power-off. The nonvolatile memory devices include a read only memory (ROM), a programmable ROM (PROM), an electrically programmable ROM (EPROM), an electrically erasable and programmable ROM (EEPROM), a flash memory device, a phase-change RAM (PRAM), a magnetic RAM (MRAM), a resistive RAM (RRAM), a ferroelectric RAM (FRAM), or the like.

SUMMARY

According to an exemplary embodiment of the present inventive concept, a memory controller is provided. The memory controller includes a first control pin and a second control pin configured to indicate one of an address state, a command state, or a data state of the memory controller, a plurality of data pins configured to transmit and receive a command signal, an address signal, and a data signal from/to a memory device, and a third control pin configured to transmit a data strobe signal to the memory device to indicate a timing to latch the address signal, the command signal, and the data signal.

In an exemplary embodiment of the present inventive concept, the first control pin transmits a command address enable signal to indicate that the command signal or the address signal is transmitted from the plurality of data pins.

In an exemplary embodiment of the present inventive concept, the second control pin transmits a command address selection signal to indicate which of the address signal and the command signal is transmitted from the plurality of data pins.

In an exemplary embodiment of the present inventive concept, the second control pin transmits a read enable signal that toggles when the memory controller receives a data signal from the plurality of data pins.

In an exemplary embodiment of the present inventive concept, the memory controller receives a data signal synchronized with data strobe signal received from the memory device.

According to an exemplary embodiment of the present inventive concept, a memory device is provided. The memory device includes a first control pin and a second control pin configured to indicate one of an address state, a command state, or a data state of the memory device, a plurality of data pins configured to transmit and receive a command signal, an address signal, and a data signal from/to the memory device, and a third control pin configured to transmit a data strobe signal to a memory controller to indicate a timing to latch the address signal, the command signal, and the data signal synchronized with the data strobe signal.

In an exemplary embodiment of the present inventive concept, the first control pin receives a command address enable signal to indicate that the command signal or the address signal is received from the plurality of data pins.

In an exemplary embodiment of the present inventive concept, the second control pin receives a command address selection signal to indicate which of the address signal and the command signal is received from the plurality of data pins.

In an exemplary embodiment of the present inventive concept, the second control pin receives a read enable signal that toggles when the memory device transmits a data signal from the plurality of data pins.

In an exemplary embodiment of the present inventive concept, the memory device latches the address signal, the command signal, and the data signal in response to at least one of a rising edge and a falling edge of the data strobe signal.

In an exemplary embodiment of the present inventive concept, the memory device operates in one of a reduced pin mode or a normal mode in response to a mode signal.

In an exemplary embodiment of the present inventive concept, the memory system is a phase-change random access memory (PRAM), a magnetic random access memory (MRAM), a resistive random access memory (RRAM), a NAND flash memory, or a NOR flash memory.

According to an exemplary embodiment of the present inventive concept, a memory system is provided. The memory system includes a memory controller, and a memory device connected to the memory controller through a control bus and a data bus, wherein the control bus transmits first and second control signals, and a data strobe signal from the memory controller to the memory device, wherein the first and second control signals indicate one of an address state, a command state, or a data state of the memory system, and the data strobe signal indicates a timing to latch a data signal, wherein the data bus transmits a command signal, an address signal, and the data signal synchronized with the data strobe signal between the memory controller and the memory device.

In an exemplary embodiment of the present inventive concept, the first control signal is a command address enable signal to indicate that the command signal or the address signal is received from the data bus.

In an exemplary embodiment of the present inventive concept, the second control signal is a command address selection signal to indicate which of the address signal and the command signal is received from the data bus.

In an exemplary embodiment of the present inventive concept, the second control signal is a read enable signal that toggles when the memory device transmits a data signal from the data bus.

In an exemplary embodiment of the present inventive concept, the memory device and the memory controller operate in one of a reduced pin mode or a normal mode in response to a mode signal.

In an exemplary embodiment of the present inventive concept, the memory device latches the address signal, the command signal, and the data signal in response to at least one of a rising edge and a falling edge of the data strobe signal.

In an exemplary embodiment of the present inventive concept, the memory system is an SD card, an MMC card, a USB flash memory driver, an eMMC, an error free NAND flash memory, a managed NAND flash memory, a perfect page NAND (PPN), or an SSD (Solid State Driver).

In an exemplary embodiment of the present inventive concept, the memory system is a phase-change random access memory (PRAM), a magnetic random access memory (MRAM), a resistive random access memory (RRAM), a NAND flash memory, or a NOR flash memory.

BRIEF DESCRIPTION OF THE FIGURES

The above and features of the present inventive concept will become more apparent by describing in detail exemplary embodiments thereof with reference to the accompanying figures in which:

FIG. 13 is a diagram showing operation states of a nonvolatile memory device shown in FIG. 12 and a relation between first to sixth control signals;

DETAILED DESCRIPTION

Figure 1:
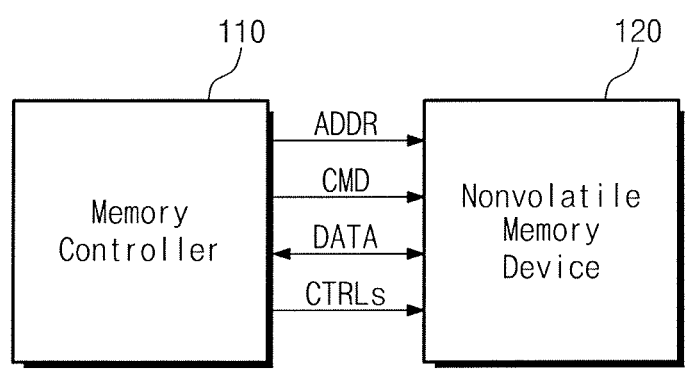
FIG. 1 is a block diagram schematically illustrating a nonvolatile memory system according to an embodiment of the inventive concept.

Exemplary embodiments of the present inventive concept will be described in detail with reference to the accompanying drawings. The present inventive concept, however, may be embodied in various different forms, and should not be construed as being limited only to the illustrated embodiments. Rather, these embodiments are provided as examples so that this disclosure will be thorough and complete, and will fully convey the concept of the inventive concept to those skilled in the art. Accordingly, known processes, elements, and techniques are not described with respect to some of the embodiments of the inventive concept. Unless otherwise noted, like reference numerals denote like elements throughout the attached drawings and written description, and thus descriptions will not be repeated. In the drawings, the sizes and relative sizes of layers and regions may be exaggerated for clarity.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Also, the term "exemplary" is intended to refer to an example or illustration.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

A nonvolatile memory device according to an exemplary embodiment of the present inventive concept may operate at one of a command state, an address state, and a data state (e.g., a data input state and a data output state) in response to first to fourth control signals.

FIG. 1 is a block diagram schematically illustrating a nonvolatile memory system according to an exemplary embodiment of the present inventive concept. Referring to FIG. 1, a nonvolatile memory system 100 includes a memory controller 110 and a nonvolatile memory device 120. The memory controller 110 may be connected to the memory device 120 through a data bus to transmit an address signal, a command signal, and a data signal and to a control bus to transmit a plurality of control signals. The data signal may be an input data and/or an output data of the memory controller 110 or the memory device 120. The memory controller 110 sends an address ADDR, a command CMD, and a plurality of control signals CTRLs to the nonvolatile memory device 120. The memory controller 110 exchange data with the nonvolatile memory device 120. For example, an address ADDR, a command CMD, or data may be exchanged between the memory controller 110 and the nonvolatile memory device 120 via the data bus DQ.

The nonvolatile memory device 120 operates in response to signals from the memory controller 110. For example, the nonvolatile memory device 120 may operate at one of a command state, an address state, a data state (e.g., a data input state and a data output state) in response to the input signals. For example, the nonvolatile memory device 120 receives a plurality of control signals CTRLs and classifies signals, received via a data bus, as a command CMD, an address ADDR, or data in response to the control signals CTRLs.

In an exemplary embodiment of the present inventive concept, the memory controller 110 may be connected to the nonvolatile memory device 120 through a data bus and a control bus. The memory controller 110 may transmit the control signals CTRLs to the nonvolatile memory device 120 via the control bus. The memory controller 110 may transmit the command CMD and the address ADDR via the data bus. The memory controller 110 may exchange data with the nonvolatile memory device 120 via the data bus.

In an exemplary embodiment of the present inventive concept, each of the memory controller 110 and the nonvolatile memory device 120 may include a plurality of control pins (not shown) and a plurality of data pins (not shown). The memory controller 110 may transmit the plurality of control signals CTRLs to the nonvolatile memory device 120 via the plurality of control pins and transmit the command CMD, the address ADDR, and data to the nonvolatile memory device 120 via the plurality of data pins. The nonvolatile memory device 120 may transmit data to the memory controller 110 via the plurality of data pins.

Although not shown in figures, the memory controller 110 may receive a logical address from an external device (e.g., a host or an application processor) and convert the logical address into a physical address that is available for the nonvolatile memory device 120 by a flash translation layer (FTL) in the memory controller 110 when the nonvolatile memory device 120 does not allow an overwrite operation and requires an erase operation before a write operation. An address ADDR that is transferred from the memory controller 110 to the nonvolatile memory device 120 may be a physical address. In the memory controller 110, an address may be converted by an FTL.

Figure 2:
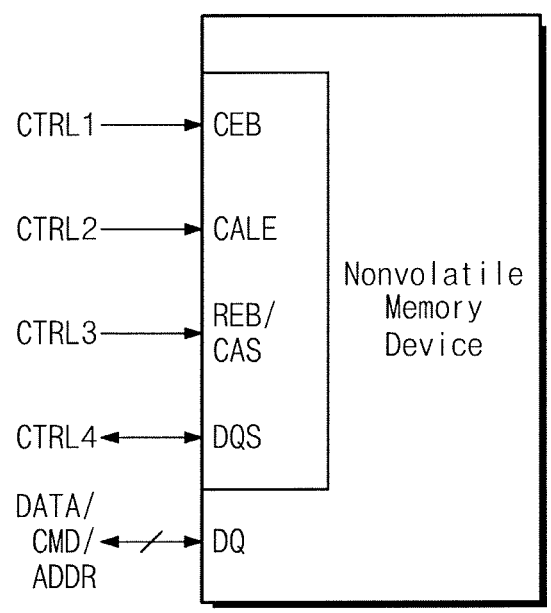
FIG. 2 is a diagram for describing an operation of a nonvolatile memory device shown in FIG. 3.
Figure 3:
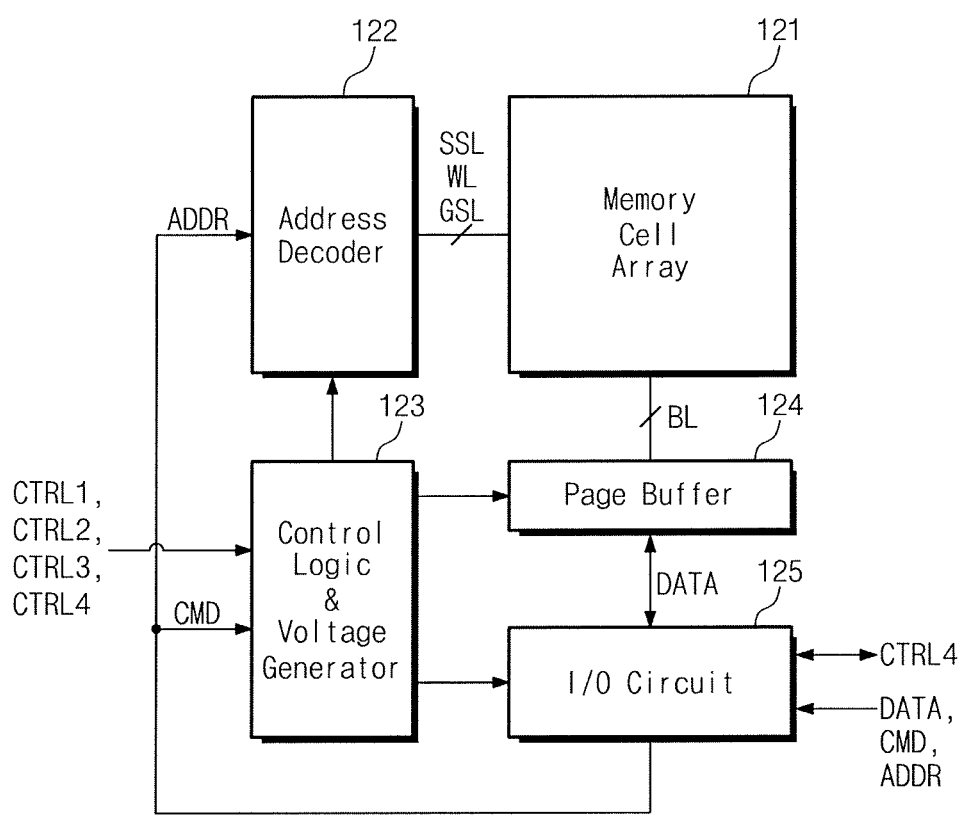
FIG. 3 is a block diagram schematically illustrating a nonvolatile memory device shown in FIG. 1.

FIG. 2 is a diagram for describing an operation of a nonvolatile memory device shown in FIG. 3. Referring to FIGS. 2 and 3, a nonvolatile memory device 120 receives first to fourth control signals CTRL1 to CTRL4 from a memory controller 110. The nonvolatile memory device 120 may employ the first to fourth control signals CTRL1 to CTRL4 as a chip enable signal CEB, a command address latch enable signal CALE, a read enable/command address select signal REB/CAS, and a data strobe signal DQS, respectively.

In an exemplary embodiment of the present inventive concept, the nonvolatile memory device 120 may be activated in response to the first control signal CTRL1 (e.g., the chip enable signal CEB). The first control signal CTRL1 may be transmitted to the nonvolatile memory device 120 via a CEB pin in the memory controller 110 and the nonvolatile memory device 120.

In an exemplary embodiment of the present inventive concept, the nonvolatile memory device 120 may classify a signal received via a data bus DQ as a command CMD and an address ADDR in response to the second control signal CTRL2 (e.g., the command address latch enable signal CALE). The second control signal CTRL2 may be transmitted to the nonvolatile memory device 120 via a CALE pin in the memory controller 110 and the nonvolatile memory device 120.

In an exemplary embodiment of the present inventive concept, the nonvolatile memory device 120 may classify the signals, classified as the command and the address, as one of a command and an address in response to the third control signal CTRL3 (e.g., the read enable/command address select signal REB/CAS). In addition, the nonvolatile memory device 120 may send output data to the memory controller 110 via the data bus DQ in response to the third control signal CTRL3 (e.g., the read enable/command address select signal REB/CAS). The third control signal CTRL3 may be transmitted to the nonvolatile memory device 120 via REB/CAS pins in the memory controller 110 and the nonvolatile memory device 120.

In an exemplary embodiment of the present inventive concept, the nonvolatile memory device 120 may capture a signal received via the data bus in response to the fourth control signal CTRL4 (e.g., the data strobe signal DQS). In addition, the nonvolatile memory device 120 may transmit output data to the memory controller 110 via the data bus in response to the fourth control signal CTRL4. The fourth control signal CTRL4 may be transmitted to the nonvolatile memory device 120 via DQS pins in the memory controller 110 and the nonvolatile memory device 120.

In an exemplary embodiment of the present inventive concept, the nonvolatile memory device 120 may transmit the fourth control signal CTRL4 to the memory controller 110 when the nonvolatile memory device 120 operates at the data output state. For example, the fourth control signal CTRL4 may be generated by the nonvolatile memory device 120 and the fourth control signal CTRL4 generated by the nonvolatile memory device 120 may be transmitted to the memory controller 120 when the nonvolatile memory device 120 operates at the data output state. Thus, the fourth control signal CTRL4 may be a bidirectional signal.

The nonvolatile memory device 120 may receive data, a command CMD, and an address ADDR from the memory controller 110 via the data bus DQ. The nonvolatile memory device 120 may send data to the memory controller 110 via the data bus DQ. The nonvolatile memory device 120 may classify signals received via the data bus DQ as one of data, an address ADDR, and a command CMD, based on the first to fourth control signals CTRL1 to CTRL4. Alternatively, the nonvolatile memory device 120 may transmit data to the memory controller 110 via the data bus DQ, based on the first to fourth control signals CTRL1 to CTRL4.

FIG. 3 is a block diagram schematically illustrating a nonvolatile memory device shown in FIG. 1. Referring to FIGS. 1 and 3, a nonvolatile memory device 120 includes a memory cell array 121, an address decoder 122, a control logic, and a voltage generator block 123, a page buffer 124, and an input/output circuit 125.

The memory cell array 121 includes a plurality of memory blocks, each of which has a plurality of cell strings. Each of the cell strings may includes a plurality of memory cells and be connected to each of a plurality of bit lines BL. Memory cells in the memory cell array 121 may be implemented with a single-level cell that stores one bit and/or a multi-level cell that stores at least two bits.

The address decoder 122 is connected to the memory cell array 121 via a string selection line SSL, a plurality of word lines WL, and a ground selection line GSL. The address decoder 122 decodes a column address of an address ADDR received via the input/output circuit 125. The address decoder 122 may control word line voltages of the word lines WL based on the decoded row address. In addition, the address decoder 122 decodes a column address and outputs the decoded column address to the page buffer 124.

The control logic and voltage generator block 123 controls the address decoder 122, the page buffer 124, and the input/output circuit 125. For example, the control logic and voltage generator block 123 receives a plurality of control signals CTRL1 to CTRL4 from a memory controller 110 and a command CMD from the input/output circuit 125. The control logic and voltage generator block 123 controls the address decoder 122, the page buffer 124, and the input/output circuit 125, based on the control signals CTRL1 to CTRL4 and the command CMD.

The control logic and voltage generator block 123 may generate a variety of high voltages for an operation of the nonvolatile memory device 120. For example, the control logic and voltage generator block 123 may produce a variety of voltages (e.g., a plurality of selection read voltages, a plurality of non-selection read voltages, a plurality of program voltages, a pass voltage, an erase voltage) for an operation of the nonvolatile memory device 120.

The page buffer 124 is connected to the memory cell array 121 via the plurality of bit lines BL. The page buffer 124 may temporarily store data written or to be written in the memory cell array 121.

The input/output circuit 125 receives the fourth control signal from the memory controller 110. The input/output circuit 125 may receive a command CMD and an address ADDR from the memory controller 110 via a data bus DQ. The input/output circuit 125 may exchange data with the memory controller 110 via the data bus.

In an exemplary embodiment of the present inventive concept, the control logic and voltage generator block 123 may determine whether signals received via a data bus correspond to a command CMD, an address ADDR, or data, based on a plurality of control signals CTRLs. Based on the determination result, the control logic and voltage generator block 123 may control the input/output circuit 125 in such a way that a signal received via a data bus is transferred to the address decoder 122, the control logic and voltage generator block 123, or the page buffer 124.

For example, if a signal received via a data bus DQ is determined as an address ADDR, the input/output circuit 125 may send the signal to the address decoder 122 as an address ADDR under the control of the control logic and voltage generator block 123. If a signal received via a data bus DQ is determined as a command CMD, the input/output circuit 125 may provide the signal to the control logic and voltage generator block 123 as a command under the control of the control logic and voltage generator block 123. When a signal received via a data bus DQ is determined as data, the input/output circuit 125 may provide the signal to the page buffer 124 as data under the control of the control logic and voltage generator block 123.

In an exemplary embodiment of the present inventive concept, the input/output circuit 125 may output data provided from the page buffer 124 to the memory controller 110 under the control of the control logic and voltage generator block 123.

Figures 4, 5:
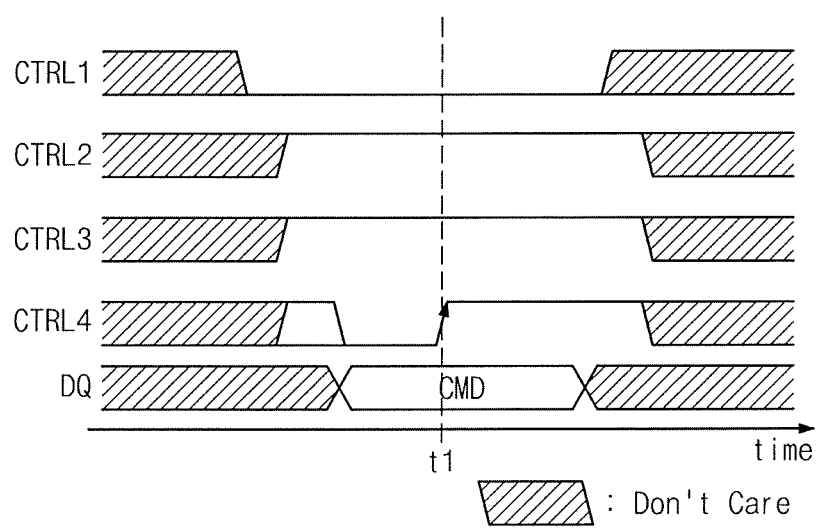
FIG. 4 is a diagram showing operation states of a nonvolatile memory device according to first to fourth control signals shown in FIG. 2.
FIG. 5 is a timing diagram for describing a command state shown in FIG. 4.

FIG. 4 is a diagram showing operation states of a nonvolatile memory device according to first to fourth control signals shown in FIG. 2. For ease of description, it is assumed that each of the first to fourth control signals CTRL1 to CTRL4 has a logically high level, a logically low level, or a pulse signal. However, the present inventive concept is not limited thereto. For example, a combination of the first to fourth control signals CTRL1 to CTRL4 may be made.

Referring to FIGS. 3 and 4, the first control signal CTRL1 is a chip enable signal CEB. The second control signal CTRL2 is a command address latch enable signal CALE. The third control signal CTRL3 is a read enable/command address select signal REB/CAS. The fourth control signal CTRL4 is a data strobe signal DQS.

A nonvolatile memory device 120 may operate at a command state when the first control signal CTRL1 has a logically low level, the second control signal CTRL2 has a logically high level, and the third control signal CTRL3 has a logically high level. In this case, the nonvolatile memory device 120 captures a signal received via a data bus DQ at a rising edge of the fourth control signal CTRL4 and recognizes the captured signal as a command CMD. In the nonvolatile memory device 120, the signal recognized as the command CMD may be provided to a control logic and voltage generator block 123.

The nonvolatile memory device 120 may operate at an address state when the first control signal CTRL1 has a logically low level, the second control signal CTRL2 has a logically high level, and the third control signal CTRL3 has a logically low level. In this case, the nonvolatile memory device 120 captures a signal received via the data bus DQ at a rising edge of the fourth control signal CTRL4 and recognizes the captured signal as an address ADDR. In the nonvolatile memory device 120, the signal recognized as the address ADDR may be provided to an address decoder 122.

The nonvolatile memory device 120 may operate at a data state that includes a data input state and a data output state. The nonvolatile memory device 120 may operate at a data input state when the first control signal CTRL1 has a logically low level, the second control signal CTRL2 has a logically low level, and the third control signal CTRL3 has a logically high level. In this case, the nonvolatile memory device 120 captures a signal received via the data bus DQ at falling and rising edges of the fourth control signal CTRL4 and recognizes the captured signal as input data. In the nonvolatile memory device 120, the signal recognized as the data may be provided to a page buffer 124.

The nonvolatile memory device 120 may operate at a data output state when the first control signal CTRL1 has a logically low level, the second control signal CTRL2 has a logically low level, and the third control signal CTRL3 has a pulse signal with a constant period. In this case, the nonvolatile memory device 120 reads data from a memory cell array 121 and outputs the read data to a memory controller 110 via the data bus DQ according to the fourth control signal CTRL4.

As described above, the nonvolatile memory device 120 may operate at one of the command, address, data input, and data output states according to the first to fourth control signals CTRL1 to CTRL4. This will be more fully described with reference to accompanying drawings.

FIG. 5 is a timing diagram for describing a command state shown in FIG. 4. Referring to FIGS. 2 to 5, a nonvolatile memory device 120 receives first to fourth control signals CTRL1 to CTRL4. The first control signal CTRL1 has a logically low level, the second control signal CTRL2 has a logically high level, the third control signal CTRL3 has a logically high level, and the fourth control signal CTRL4 is a pulse signal. In this case, as described with reference to FIG. 4, a nonvolatile memory device 120 may operate at a command state.

The nonvolatile memory device 120 may receive a signal corresponding to a command CMD via a data bus DQ. The nonvolatile memory device 120 captures a signal received via a data bus DQ at t1 (e.g., a rising edge of the fourth control signal CTRL4) and recognizes the captured signal as a command CMD.

Figure 6:
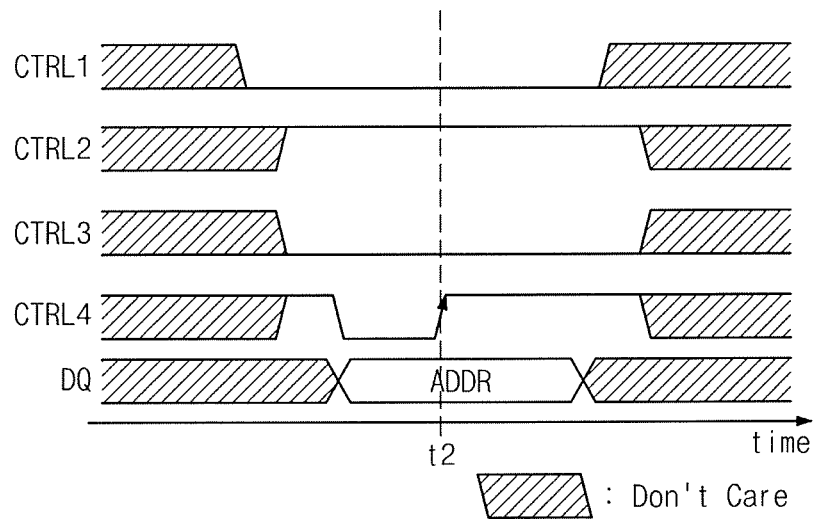
FIG. 6 is a timing diagram for describing an address state shown in FIG. 4.

FIG. 6 is a timing diagram for describing an address state shown in FIG. 4. Referring to FIGS. 2, 4, and 6, a nonvolatile memory device 120 receives first to fourth control signals CTRL1 to CTRL4. The first control signal CTRL1 has a logically low level, the second control signal CTRL2 has a logically high level, the third control signal CTRL3 has a logically low level, and the fourth control signal CTRL4 is a pulse signal. In this case, as described with reference to FIG. 4, a nonvolatile memory device 120 may operate at an address state.

The nonvolatile memory device 120 may receive a signal corresponding to an address ADDR via a data bus DQ. The nonvolatile memory device 120 captures a signal received via a data bus DQ at t2 (e.g., a rising edge of the fourth control signal CTRL4) and recognizes the captured signal as an address ADDR.

Figure 7:
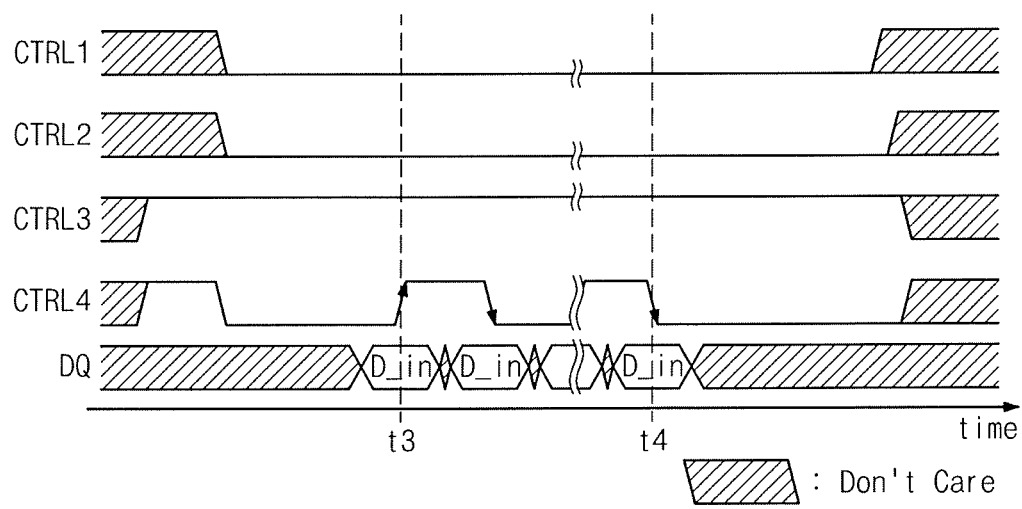
FIG. 7 is a timing diagram for describing a data input state shown in FIG. 4.

FIG. 7 is a timing diagram for describing a data input state shown in FIG. 4. Referring to FIGS. 2, 4, and 7, a nonvolatile memory device 120 receives first to fourth control signals CTRL1 to CTRL4. The first control signal CTRL1 has a logically low level, the second control signal CTRL2 has a logically low level, the third control signal CTRL3 has a logically high level, and the fourth control signal CTRL4 is a pulse signal. In this case, as described with reference to FIG. 4, a nonvolatile memory device 120 may operate at a data input state.

The nonvolatile memory device 120 may receive signals corresponding to input data D_in via a data bus DQ. The nonvolatile memory device 120 captures signals received via a data bus DQ at falling and rising edges of the fourth control signal CTRL4 that exists between t3 and t4, and recognizes the captured signals as input data D_in.

In an exemplary embodiment of the present inventive concept, the fourth control signal CTRL4 may be of a pre-amble state during a predetermined time before capturing of the input data D_in. The pre-amble state may indicate a state for stabilization of a channel through which the nonvolatile memory device 120 receives the input data D_in. For example, the fourth control signal CTRL4 may have a logically low level at the pre-amble state.

In exemplary embodiments, the fourth control signal CTRL4 may be of a post-amble state during a predetermined time after capturing of all input data D_in. The post-amble state may indicate a state for stabilization of a channel after the nonvolatile memory device 120 receives all input data D_in. For example, the fourth control signal CTRL4 may have a logically low level at the post-amble state.

Figure 8:
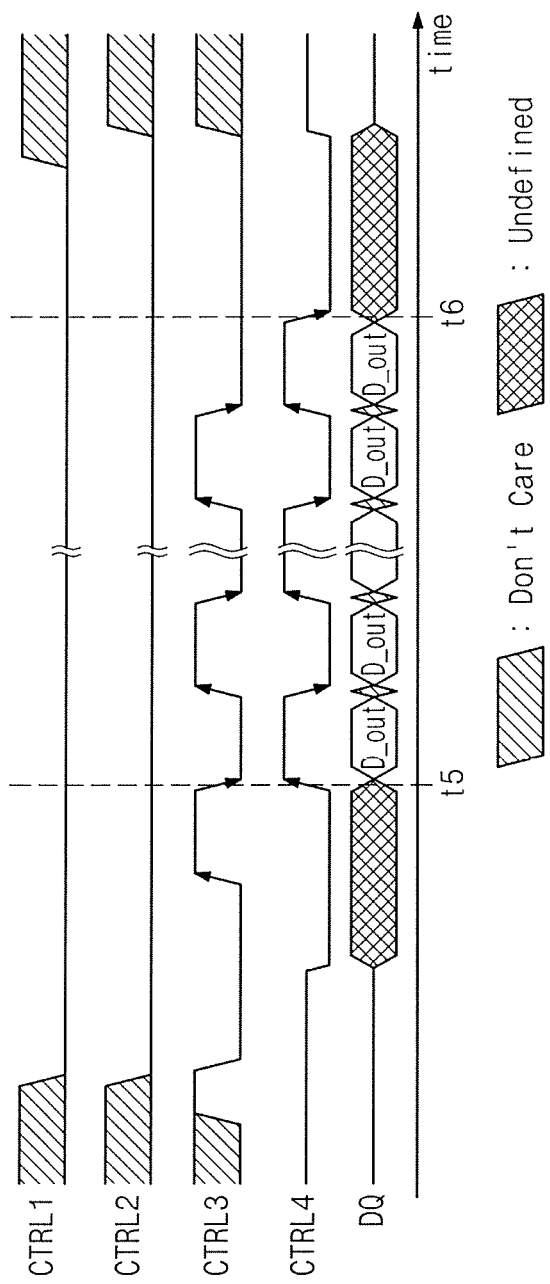
FIG. 8 is a timing diagram for describing a data output state shown in FIG. 4.

FIG. 8 is a timing diagram for describing a data output state shown in FIG. 4. Referring to FIGS. 2, 4, and 8, a nonvolatile memory device 120 receives first to fourth control signals CTRL1 to CTRL4. The first control signal CTRL1 has a logically low level, the second control signal CTRL2 has a logically low level, and the third and fourth control signals CTRL3 and CTRL4 are a pulse signal. In this case, as described with reference to FIG. 4, a nonvolatile memory device 120 may operate at a data output state.

The nonvolatile memory device 120 reads data D_out stored in the nonvolatile memory device 120 in response to the first to third control signals CTRL1 to CTRL3 and outputs the read data D_out to a memory controller 110 based on the fourth control signal CTRL4. For example, in the nonvolatile memory device 120, data D_out stored in a page buffer 124 may be transferred to an input/output circuit 125 in synchronization with a rising or falling edge of the third control signal CTRL3. The nonvolatile memory device 120 provides the memory controller 110 with the data D_out stored in the input/output circuit 125 from t5 to t6. In an exemplary embodiment of the present inventive concept, the memory controller 110 may receive the output data D_out from the nonvolatile memory device 120 based on the fourth control signal CTRL4.

In an exemplary embodiment of the present inventive concept, the third control signal CTRL3 may be in a pre-amble state during a predetermined time before the output data D_out is transferred to the input/output circuit 125. The fourth control signal CTRL4 may be in a pre-amble state during a predetermined time before the output data D_out is transferred to the memory controller 110.

In an exemplary embodiment of the present inventive concept, the third control signal CTRL3 may be in a post-amble state during a predetermined time after all output data D_output is transferred to the input/output circuit 125. The fourth control signal CTRL4 may be in a post-amble state during a predetermined time after all output data D_output is transferred to the memory controller 110.

With the above-described exemplary embodiment of the present inventive concept, a nonvolatile memory system 100 may control a command state, an address state, a data state (e.g., a data input state and a data output state) of a nonvolatile memory device 120 using first to fourth control signals CTRL1 to CTRL4. The number of control signals is reduced. For example, the number of pins included in the nonvolatile memory device 120 is reduced, thereby lowering an area and a cost needed to make the nonvolatile memory device 120.

Figure 9:
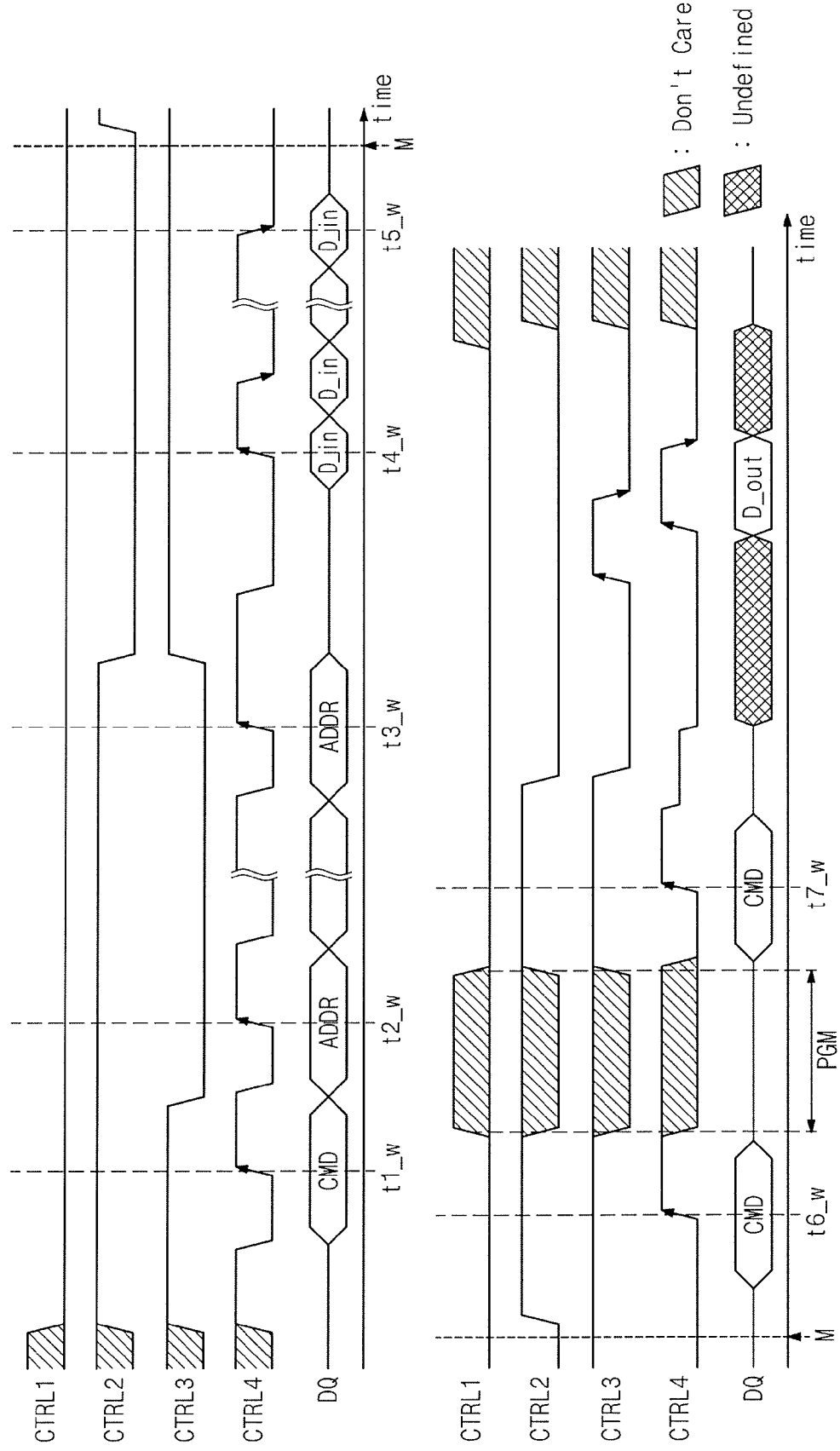
FIG. 9 is a timing diagram for describing a write operation of a nonvolatile memory device shown in FIG. 3.

FIG. 9 is a timing diagram for describing a write operation of a nonvolatile memory device shown in FIG. 3. For ease of description, a write operation of a nonvolatile memory device 120 will be described using a page program operation. However, the inventive concept is not limited thereto.

Referring to FIGS. 1, 3, and 9, the nonvolatile memory device 120 receives first to fourth control signals CTRL1 to CTRL4 from a memory controller 110. The nonvolatile memory device 120 may receive a command CMD, an address ADDR, and input data D_in from the memory controller 110 via a data bus DQ. The nonvolatile memory device 120 may transmit output data D_out to the memory controller 110 via the data bus DQ. For example, the output data D_out may be data indicating a program-verification result.

First, the first control signal CTRL1 has a logically low level, the second control signal CTRL2 has a logically high level, the third control signal CTRL3 has a logically high level, and the fourth control signal CTRL4 is a pulse signal. The nonvolatile memory device 120 recognizes signals received via the data bus DQ at a rising edge of the fourth control signal CTRL4 as a command CMD. In the nonvolatile memory device 120, a signal received via the data bus at the rising edge (e.g., t1_w) of the fourth control signal CTRL4 is provided to a control logic and voltage generator block 123. In an exemplary embodiment of the present inventive concept, the command CMD that is received at t1_w may be a first page program command.

After the third control signal CTRL3 transitions to a logically low level, the nonvolatile memory device 120 recognizes a signal received via the data bus DQ at a rising edge of the fourth control signal CTRL4 as an address ADDR. In the nonvolatile memory device 120, a signal received via the data bus DQ at a rising edge of the fourth control signal CTRL4 is provided to an address decoder 122 as an address ADDR. Between t2_w and t3_w, the nonvolatile memory device 120 may recognize signals received via the data bus DQ at rising edges of the fourth control signal CTRL4 as the address ADDR. For example, the nonvolatile memory device 120 may receive a plurality of addresses ADDR during a predetermined time. In an exemplary embodiment of the present inventive concept, the addresses ADDR may include a plurality of column, but not limited to, addresses, a plurality of row addresses, a page address, a block address, and so on.

After the second control signal CTRL2 transitions to a logically low level and the third control signal CTRL3 transitions to a logically high level, the nonvolatile memory device 120 recognizes signals received via the data bus DQ at rising and falling edges of the fourth control signal CTRL4 as input data D_in. For example, between t4_w and t5_w, the nonvolatile memory device 120 recognizes signals received via the data bus DQ at rising and falling edges of the fourth control signal CTRL4 as input data D_in. A plurality of input data D_in may be provided to the nonvolatile memory device 120 during a predetermined time. In the nonvolatile memory device 120, the input data D_in received via the data bus DQ may be transferred to a page buffer 124.

After the second control signal CTRL2 transitions to a logically high level, the nonvolatile memory device 120 recognizes a signal received via the data bus DQ at a rising edge (e.g., t6_w) of the fourth control signal CTRL4 as a command CMD. In the nonvolatile memory device 120, a signal received via the data bus DQ may be provided to a control logic and voltage generator block 123 as a command CMD. For example, a command CMD received at t6_w may be a second page program command. The first and second page program commands may be a command set that corresponds to a page program operation.

The nonvolatile memory device 120 may perform a program operation during a predetermined time. In the nonvolatile memory device 120, the input data D_in may be programmed at one or more pages, corresponding to the address ADDR transferred to an address decoder 122, from among a plurality of page of a memory cell array 121.

Afterwards, the first control signal CTRL1 has a logically low level, the second control signal CTRL2 has a logically high level, and the third control signal CTRL3 has a logically high level. The nonvolatile memory device 120 recognizes a signal received via the data bus DQ at a rising edge (e.g., t7_w) of the fourth control signal CTRL4 as a command CMD. In the nonvolatile memory device 120, a signal received via the data bus DQ at t7_w may be provided to the control logic and voltage generator block 123 as a command CMD. For example, a command CMD received at t7_w may be a read command for outputting a program-verification result.

In the nonvolatile memory device 120, a result of verifying programmed memory cells may be output via the data bus DQ as output data D_out. At this time, the first control signal CTRL1 is at a logically low level, the second control signal CTRL2 is at a logically low level, and the third and fourth control signals CTRL3 and CTRL4 are a pulse signal. In the nonvolatile memory device 120, the output data D_out may be provided to an input/output circuit 125 based on the third control signal CTRL3. The nonvolatile memory device 120 may output the output data D_out to the memory controller 110 via the data bus DQ based on the fourth control signal CTRL4.

Figure 10:
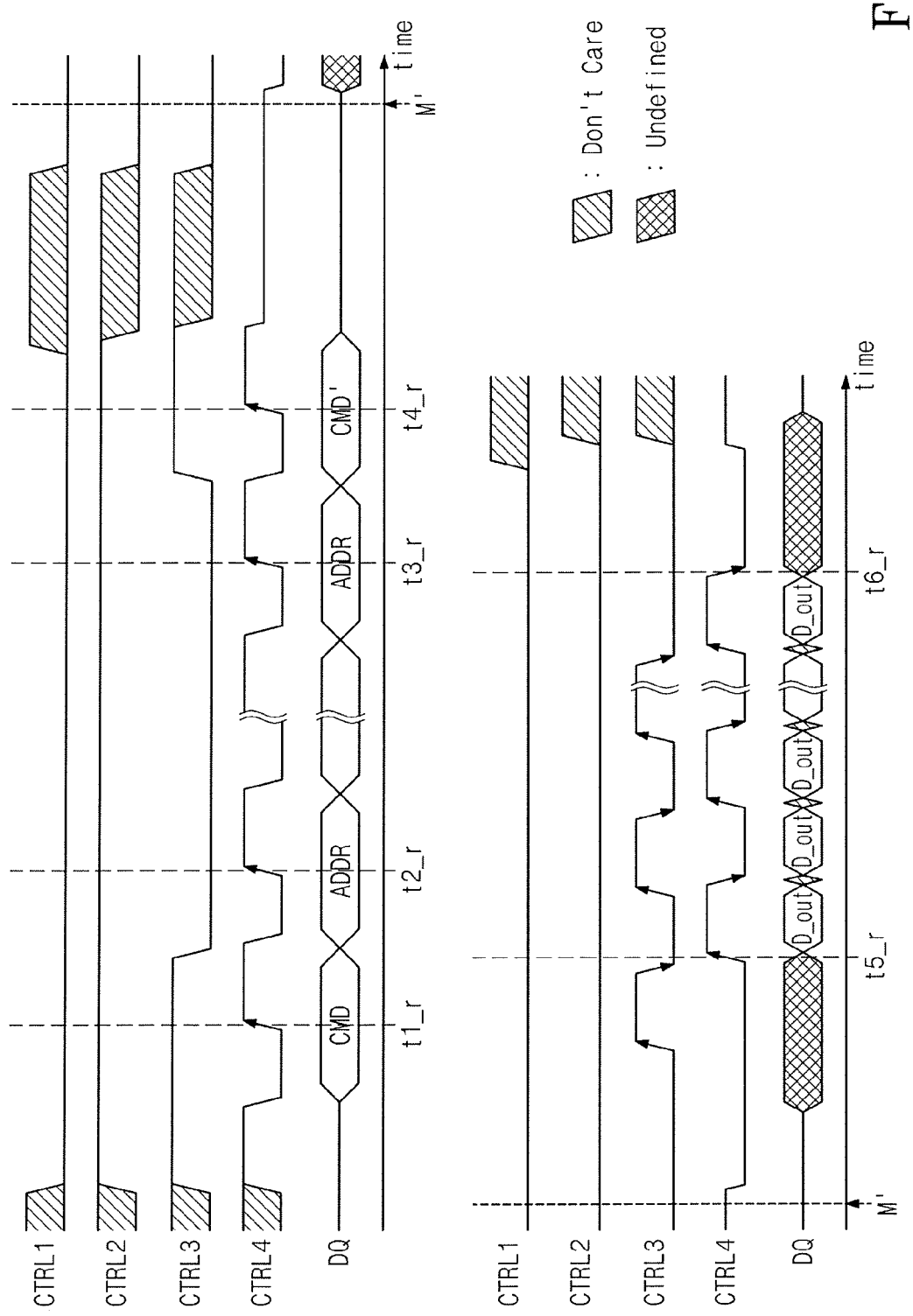
FIG. 10 is a timing diagram for describing a read operation of a nonvolatile memory device shown in FIG. 3.

FIG. 10 is a timing diagram for describing a read operation of a nonvolatile memory device shown in FIG. 3. For ease of description, a read operation of a nonvolatile memory device 120 will be described using a page read operation.

Referring to FIGS. 1, 3, and 10, the nonvolatile memory device 120 receives first to fourth control signals CTRL1 to CTRL4 from a memory controller 110. The nonvolatile memory device 120 may transfer output data D_out to the memory controller 110 via a data bus DQ.

First, the first control signal CTRL1 has a logically low level, the second control signal CTRL2 has a logically high level, the third control signal CTRL3 has a logically high level, and the fourth control signal CTRL4 is a pulse signal. The nonvolatile memory device 120 recognizes a signal received via the data bus DQ at a rising edge (e.g., t1_r) of the fourth control signal CTRL4 as a command CMD. In the nonvolatile memory device 120, a signal received via the data bus at t1_r is transferred to a control logic and voltage generator block 123. The command CMD that is received at t1_r may be a first page read command.

After the third control signal CTRL3 transitions to a logically low level, the nonvolatile memory device 120 recognizes a signal received via the data bus DQ at a rising edge of the fourth control signal CTRL4 as an address ADDR. In the nonvolatile memory device 120, a signal received via the data bus DQ at a rising edge of the fourth control signal CTRL4 is provided to an address decoder 122 as an address ADDR. Between t2_r and t3_r, the nonvolatile memory device 120 may recognize signals received via the data bus DQ at rising edges of the fourth control signal CTRL4 as the address ADDR. For example, the nonvolatile memory device 120 may receive a plurality of addresses ADDR during a predetermined time.

After the third control signal CTRL3 transitions to a logically high level, the nonvolatile memory device 120 recognizes a signal received via the data bus DQ at a rising edge (e.g., t4_r) of the fourth control signal CTRL4 as a command. In the nonvolatile memory device 120, a signal recognized as a command may be provided to a control logic and voltage generator block 123. For example, a command CMD' received at t4_r may be a second page read command. The first and second page read commands may be a command set that corresponds to a page read operation.

In addition, the nonvolatile memory device 120 reads data from a page, corresponding to the received address ADDR, from among a plurality of pages in a memory cell array 121 during a predetermined time.

When the first control signal CTRL1 has a logically low level, the second control signal CTRL2 has a logically low level, the third and fourth control signals CTRL3 and CTRL4 have a pulse, the nonvolatile memory device 120 provides the memory controller 110 with the read data via the data bus DQ as output data D_out, based on the fourth control signal CTRL4. For example, in the nonvolatile memory device 120, a page buffer 124 reads and stores data from a page corresponding to the received address ADDR, and data stored in the page buffer 124 is transferred to an input/output circuit 125 based on the third control signal CTRL3. In an exemplary embodiment of the present inventive concept, the data stored in the page buffer 124 is transferred to an input/output circuit 125 at rising and falling edges of the third control signal CTRL3.

The nonvolatile memory device 120 transfers data stored in the input/output circuit 125 to the memory controller 110 as output data D_out, based on the fourth control signal CTRL4. For example, the nonvolatile memory device 120 outputs a plurality of output data D_out to the memory controller 110 during a period in time from t5_r to t6_r. In an exemplary embodiment of the present inventive concept, the data stored in the input/output circuit 125 may be synchronized with the fourth control signal CTRL4 to transmit to the memory controller 110.

Figure 11:
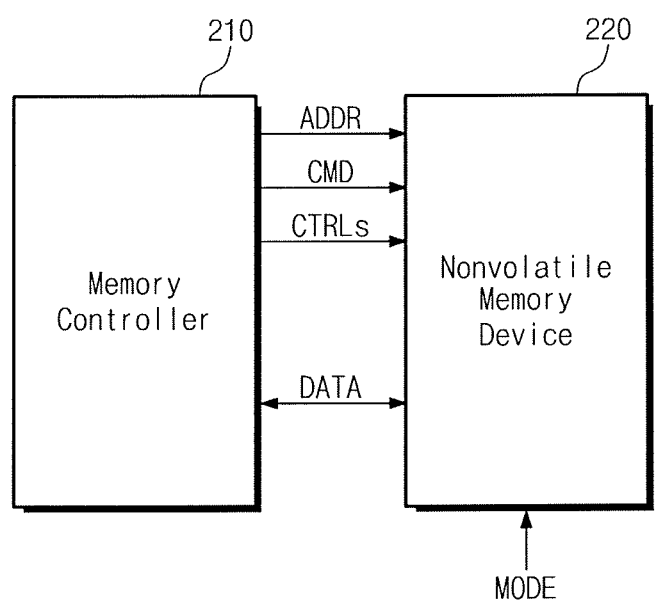
FIG. 11 is a block diagram schematically illustrating a nonvolatile memory system according to an exemplary embodiment of the present inventive concept.

FIG. 11 is a block diagram schematically illustrating a nonvolatile memory system according to an exemplary embodiment of the present inventive concept. Referring to FIG. 11, a nonvolatile memory system 200 includes a memory controller 210 and a nonvolatile memory device 220. The memory controller 210 may be connected to the memory device 220 through a data bus to transmit an address signal, a command signal and a data signal and a control bus to transmit a plurality of control signals. The data signal may be an input data and a output data of the memory controller 210 or the memory device 220. The memory controller 210 and the nonvolatile memory device 220 may have the substantially same structure and functions as the memory controller 110 and a nonvolatile memory device 120 described with reference to FIG. 1, and a detailed description thereof is thus omitted and the description of FIG. 11 will be focused on the different structure and functions between the exemplary embodiments of the present inventive concept.

An operation of the nonvolatile memory device 220 may depend on one of first and second operation modes. For example, the nonvolatile memory device 220 receives a mode control signal MODE. The mode control signal MODE may be a signal that represents one of the first and second operation modes. For example, the first operation mode is a signal-reduced mode, and the second operation mode is a normal mode. The mode control signal MODE may be a signal that is generated according to a control of an external device (e.g., host), a user, or a vendor.

For example, the memory controller 210 sends first to fourth control signals CTRL1 to CTRL4 to the nonvolatile memory device 220 when the nonvolatile memory device 220 operates in the first operation mode, and the nonvolatile memory device 220 operates at one of a command state, an address state, a data state (a data input state and a data output state) based on the first to fourth control signals CTRL1 to CTRL4. The memory controller 210 sends first to sixth control signals CTRL1 to CTRL6 to the nonvolatile memory device 220 when the nonvolatile memory device 220 operates in the second operation mode, and the nonvolatile memory device 220 operates at one of the command state, address state, data input state, and data output state based on the first to sixth control signals CTRL1 to CTRL6.

In an exemplary embodiment of the present inventive concept, an operation mode of the nonvolatile memory device 220 may be selected according to an operation mode of the memory controller 210. For example, in case the memory controller 210 operates based on the first to sixth control signals, the operation mode of the nonvolatile memory device 220 may be selected in such a way that it operates based on the first to sixth control signals. Alternatively, in case the memory controller 210 operates based on the first to fourth control signals, the operation mode of the nonvolatile memory device 220 may be selected in such a way that it operates based on the first to fourth control signals.

In an exemplary embodiment of the present inventive concept, the first operation mode represents a mode that is based on an operation method of a nonvolatile memory system described with reference to FIGS. 1 to 10. The second operation mode will be described with reference to FIG. 13.

In an exemplary embodiment of the present inventive concept, information about an operation mode selected according to the mode control signal MODE may be stored in a separate storage circuit (e.g., MRS, fuse, or register) in the nonvolatile memory device 220, and the nonvolatile memory device 220 may operate based on the operation-mode information thus stored.

Although not shown in figures, the memory controller 210 may receive the mode control signal MODE from an external device and control an operation mode of the nonvolatile memory device 220 based on the received mode control signal MODE.

Figure 12:
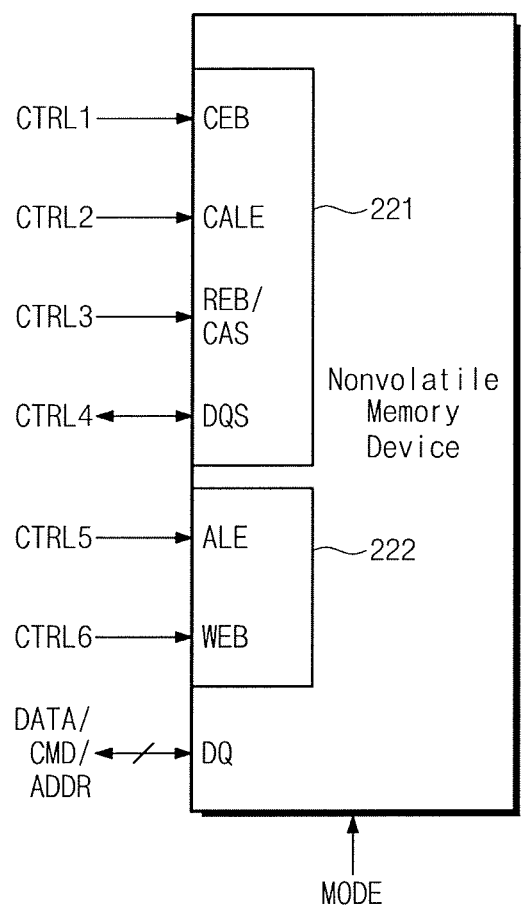
FIG. 12 is a block diagram schematically illustrating a nonvolatile memory device shown in FIG. 11.

FIG. 12 is a block diagram schematically illustrating a nonvolatile memory device shown in FIG. 11. Referring to FIGS. 11 and 12, a nonvolatile memory device 220 receives first to sixth control signals CTRL1 to CTRL6 from a memory controller 210. The nonvolatile memory device 220 receives a command CMD, an address ADDR, and data from the memory controller 210 via a data bus DQ. The nonvolatile memory device 220 transfers data to the memory controller 210 via the data bus DQ.

For example, the nonvolatile memory device 120 employs the first to fourth control signals CTRL1 to CTRL4 as signals that are included in a first group 221. The first signal group 221 includes a chip enable signal CEB, command address latch enable signal CALE, a read enable/command address select signal REB/CAS, and a data strobe signal DQS. The nonvolatile memory device 220 uses the fifth and sixth control signals CTRL5 and CTRL6 as signals included in a second signal group 222. The second signal group 222 may contain ALE and WEB.

The nonvolatile memory device 220 may operate at one of first and second operation modes according to a mode control signal MODE.

If the nonvolatile memory device 220 operates in the first operation mode, it operates based on an operation that is described with reference to FIGS. 1 to 10. That is, the nonvolatile memory device 220 may operate based on the first signal group 221. For example, the nonvolatile memory device 220 may operate at one of a command state, an address state, and a data state (a data input state and a data output state) using the first to fourth control signals CTRL1 to CTRL4. The nonvolatile memory device 220 may employ the first, second, third, and fourth control signals CTRL1 to CTRL4 as a chip enable signal CEB, a command address latch enable signal CALE, a read enable/command address select signal REB/CAS, and a data strobe signal DQS, respectively.

In case the nonvolatile memory device 220 operates in the second operation mode (e.g., a normal mode), it operates at one of a command state, an address state, a data state (a data input state and a data output state) using the first to sixth control signals CTRL1 to CTRL6. For example, the nonvolatile memory device 220 may operate based on signals that are included in the first and second signal groups 221 and 222. For example, the nonvolatile memory device 220 may use the first, second, third, fourth, fifth, and sixth control signals CTRL1 to CTRL6 as a chip enable signal CEB, a command latch enable signal CLE, a read enable signal REB, a data strobe signal DQS, an address latch enable signal ALE, and a write enable signal WEB, respectively.

FIG. 13 is a diagram showing operation states of a nonvolatile memory device shown in FIG. 12 and a relation between first to sixth control signals. Referring to FIGS. 12 and 13, a nonvolatile memory device 220 may operate at one of first and second operation modes MODE1 and MODE2 according to a mode control signal MODE.

First, in case the nonvolatile memory device 220 operates in the first operation mode MODE1, it operates at a command state, an address state, a data input state, or a data output state based on first to fourth control signals CTRL1 to CTRL4. The first operation mode MODE1 of the nonvolatile memory device 220 has been described with reference to FIGS. 1 to 10, and a detailed description thereof is thus omitted. The nonvolatile memory device 220 may not be affected by the fifth and sixth control signals CTRL5 and CTRL6 when operating in the first operation mode MODE1. Or, the nonvolatile memory device 220 may not use the fifth and sixth control signals CTRL5 and CTRL6 when operating in the first operation mode MODE1. Alternatively, the memory controller 210 may not send the fifth and sixth control signals CTRL5 and CTRL6 to the nonvolatile memory device 220 that is set to operate in the first operation mode MODE1.

The nonvolatile memory device 220 operates based on the first to sixth control signals CTRL1 to CTRL6 when operating in the second operation mode MODE2. For example, the nonvolatile memory device 220 may operate at a command state when the first control signal CTRL1 has a logically low level, the second control signal CTRL2 has a logically high level, the third control signal CTRL3 has a logically high level, the fifth control signal CTRL5 has a logically low level, and the sixth control signal CTRL6 is a pulse signal.

When the first control signal CTRL1 has a logically low level, the second control signal CTRL2 has a logically low level, the third control signal CTRL3 has a logically high level, the fifth control signal CTRL5 has a logically high level, and the sixth control signal CTRL6 is a pulse signal, the nonvolatile memory device 220 may operate at an address state.

In case the first control signal CTRL1 has a logically low level, the second control signal CTRL2 has a logically low level, the third control signal CTRL3 has a logically high level, the fourth control signal CTRL4 is a pulse signal, the fifth control signal CTRL5 has a logically low level, and the sixth control signal CTRL6 has a logically high level, the nonvolatile memory device 220 may operate at a data input state.

The nonvolatile memory device 220 may operate at a data output state when the first control signal CTRL1 has a logically low level, the second control signal CTRL2 has a logically low level, the third control signal CTRL3 is a pulse signal, the fourth control signal CTRL4 is a pulse signal, the fifth control signal CTRL5 has a logically low level, and the sixth control signal CTRL6 has a logically high level.

As described above, the nonvolatile memory system 200 according to an exemplary embodiment of the present inventive concept may operate at one of the first and second operation modes MODE1 and MODE2. For example, the nonvolatile memory system 200 may operate in the first operation mode MODE1 (e.g., a signal-reduced mode based on the first to fourth control signals) and in the second operation mode MODE2 (e.g., normal mode based on the first to sixth control signals). When the nonvolatile memory system 200 operates in the first operation mode MODE1, the memory controller 210 sends the first to fourth control signals CTRL1 to CTRL4 to the nonvolatile memory device 220. At this time, the nonvolatile memory device 220 may operate at a command state, an address state, a data input state, or a data output state in response to the first to fourth control signals CTRL1 to CTRL4. When the nonvolatile memory system 200 operates in the second operation mode MODE2, the memory controller 210 sends the first to sixth control signals CTRL1 to CTRL6 to the nonvolatile memory device 220. At this time, the nonvolatile memory device 220 may operate at a command state, an address state, a data input state, or a data output state in response to the first to sixth control signals CTRL1 to CTRL6.

With the above description, selecting one of the first and second operation modes MODE1 and MODE2 and operating at the selected operation mode, the nonvolatile memory system 200 may be compatible with a conventional nonvolatile memory device. Also, power consumption and a cost may decrease by reducing the number of control signals.

Figure 14:
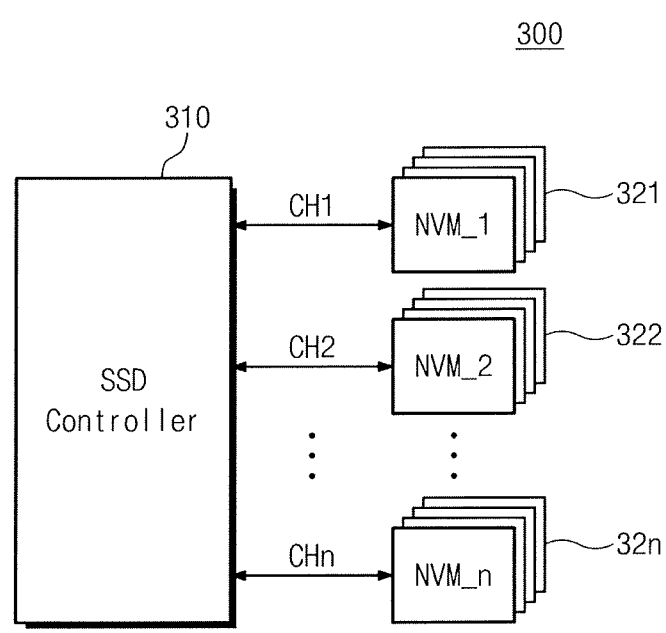
FIG. 14 is a block diagram schematically illustrating a nonvolatile memory system according to an exemplary embodiment of the present inventive concept.

FIG. 14 is a block diagram schematically illustrating a nonvolatile memory system according to an exemplary embodiment of the present inventive concept. Referring to FIG. 14, a nonvolatile memory system 300 contains a memory controller 310 and a plurality of nonvolatile memory devices 321 to 32n. The memory controller 310 and the nonvolatile memory devices 321 to 32n have been described with reference to FIGS. 1 to 11, and a detailed description thereof is thus omitted.

The memory controller 310 communicates with the nonvolatile memory devices 321 to 32n via a plurality of channels CH1 to CHn. For example, the memory controller 310 may send an address, a command, data, and a plurality of control signals to each of the nonvolatile memory devices 321 to 32n via the plurality of channels CH1 to CHn.

In an exemplary embodiment of the present inventive concept, the nonvolatile memory devices 321 to 32n may be implemented with a nonvolatile memory device described with reference to FIGS. 1 to 13. For example, each of the nonvolatile memory devices 321 to 32n receives first to fourth control signals CTRL1 to CTRL4 via the plurality of channels and operates at a command state, an address state, a data input state, or a data output state based on the first to fourth control signals CTRL1 to CTRL4 thus received.

In an exemplary embodiment of the present inventive concept, some of the nonvolatile memory devices 321 to 32n may be inactivated in response to the first control signal CTRL1. The nonvolatile memory device thus inactivated may not perform an operation such as a read operation, a write operation, or an erase operation. For example, a nonvolatile memory device may be inactivated when receiving a first control signal CTRL1 with a logically high level.

With the above description, the nonvolatile memory devices 321 to 32n may communicate with a memory controller via a plurality of channels CH1 to CHn. Since each of the nonvolatile memory devices 321 to 32n operates based on first to fourth control signals, the number of control signals may be reduced. This means that a cost, an area, and power consumption decrease in proportion to a decrease in the number of pins for receiving signals from the memory controller.

Figure 15:
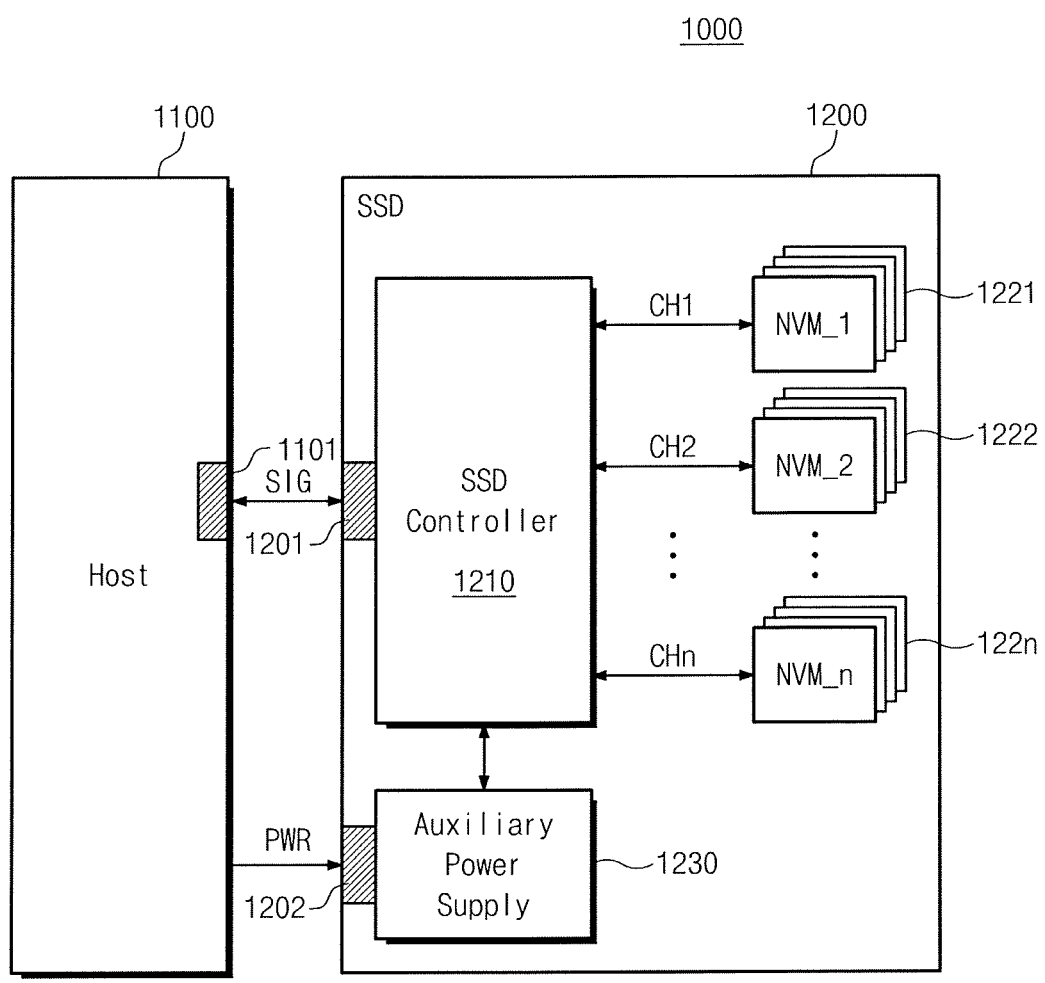
FIG. 15 is a block diagram illustrating a solid state drive according to an exemplary embodiment of the present inventive concepts.

FIG. 15 is a block diagram illustrating a solid state drive according to an exemplary embodiment of the present inventive concept. Referring to FIG. 15, a solid state drive (SSD) system 1000 comprises a host 1100 and an SSD 1200.

The host 1100 writes data at the SSD 1200 and reads data from the SSD 1200. The host 1100 sends signals SGL including a command, an address, state information, and so on to the SSD 1200 through the host interface 1101. For example, the host interface 1101 may be based on a variety of RF communication protocols, such as CDMA (Code Division Multiple Access), GSM (Global System for Mobile communication), WCDMA (wideband CDMA), CDMA-2000, TDMA (Time Division Multiple Access), LTE (Long Term Evolution), Wimax, WLAN, UWB, Bluetooth, WI-DI, and so on.

The SSD 1200 exchanges signals SGL with the host 1100 through the host interface 1101 and is supplied with a power through a power connector 1202. The SSD 1200 comprises a plurality of nonvolatile memories 1221 to 122n, an SSD controller 1210, and an auxiliary power supply 1230. The nonvolatile memories 1221 to 122n may be implemented with nonvolatile memory devices, such as PRAM, MRAM, ReRAM, FRAM, and so on, as well as a flash memory.

The plurality of nonvolatile memories 1221 to 122n may be used as a storage medium of the SSD 1200. The nonvolatile memories 1221 to 122n are connected to the SSD controller 1210 through a plurality of channels CH1 to CHn. One channel may be connected to one or more nonvolatile memories. Nonvolatile memories connected to one channel may be connected to the same data bus.

The SSD controller 1210 exchanges signals SGL with the host 1100 through the host interface 1201. Herein, the signals SGL may include a command, an address, data, and so on. The SSD controller 1210 is configured to write or read out data to or from nonvolatile memories according to a command of the host 1100.

The auxiliary power supply 1230 is connected to the host 1100 via the power connector 1201. The auxiliary power supply 1230 is charged by a power PWR from the host 1100. The auxiliary power supply 1230 may be placed inside or outside the SSD 1200. For example, the auxiliary power supply 1230 may be put on a main board to supply an auxiliary power to the SSD 1200.

In an exemplary embodiment of the present inventive concept, the SSD controller 1210 and the nonvolatile memory devices 1221 to 122n may be implemented with a memory controller and a nonvolatile memory device described with reference to FIGS. 1 to 13. For example, the SSD controller 1210 sends first to fourth control signals CTRL1 to CTRL4 to each of the nonvolatile memory devices 1221 to 122n via the plurality of channels CH1 to CHn. Each of the nonvolatile memory devices 1221 to 122n may operate at a command state, an address state, a data input state, or a data output state based on the first to fourth control signals CTRL1 to CTRL4. With the above description, since each of the nonvolatile memory devices 1221 to 122n operates based on the first to fourth control signals CTRL1 to CTRL4, the number of control signals may be reduced. This means that a cost, an area, and power consumption decrease in proportion to a decrease in the number of pins for receiving signals.

Figure 16:
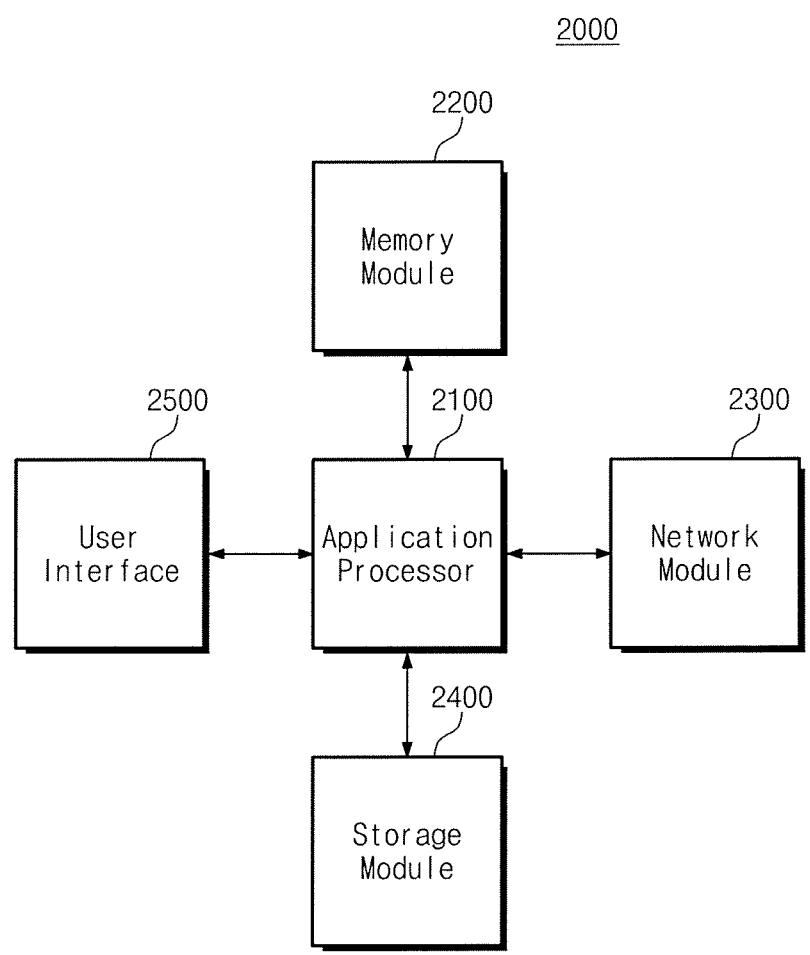
FIG. 16 is a block diagram schematically illustrating a user system according to an exemplary embodiment of the present inventive concept.

FIG. 16 is a block diagram schematically illustrating a user system according to an exemplary embodiment of the present inventive concept. Referring to FIG. 16, a user system 2000 includes an application processor 2100, a memory module 2200, a network module 2300, a storage module 2400, and an input interface 2500. As another example, the user system 2000 may be provided as one of computing systems, such as a ultra-mobile personal computer (UMPC), a workstation, a net-book, a personal digital assistance (PDA), a portable computer (PC), a web tablet, a wireless phone, a mobile phone, a smart phone, an e-book, a portable multimedia player (PMP), a portable game console, a navigation device, a black box, a digital camera, a digital multimedia broadcasting (DMB) player, a digital audio recorder, a digital audio player, a digital picture recorder, a digital picture player, a digital video recorder, a digital video player, and so on.

The application processor 2100 drives components of the user system 2000, an operating system, and so on. For example, the application processor 2100 may include controllers for controlling components of the user system 2000, graphics engines, a variety of interfaces, and so on.

The memory module 2200 may operate as a main memory, a working memory, a buffer memory, or a cache memory of the user system 2000. The memory module 2200 may be implemented with a volatile random access memory such as a DRAM (Dynamic Random Access Memory), an SDRAM (Synchronous DRAM), a DDR SDRAM (Double Date Rate SDRAM), a DDR2 SDRAM, a DDR3 SDRAM, an LPDDR DRAM, an LPDDR2 DRAM, or an LPDDR3 DRAM, or the like, or a nonvolatile random access memory such as a PRAM (Phase-change RAM), an MRAM (Magnetic RAM), an RRAM (Resistive RAM), an FRAM (Ferroelectric RAM), or the like.

The network module 2300 communicates with external devices. For example, the network module 2300 may support wireless communications, such as CDMA (Code Division Multiple Access), GSM (Global System for Mobile communication), WCDMA (wideband CDMA), CDMA- 2000, TDMA (Time Division Multiple Access), LTE (Long Term Evolution), Wimax, WLAN, UWB, Bluetooth, WI-DI, and so on.

The storage module 2400 stores data. For example, the storage module 2400 stores data received from an external device. Or, the storage module 2400 provides the application processor 2100 with data stored therein. For example, the storage module 2400 may be implemented with a semiconductor memory device such as a PRAM, an MRAM, an RRAM, a NAND flash memory, a NOR flash memory, a three-dimensional NAND flash memory, or the like. In an exemplary embodiment of the present inventive concept, the storage module 2400 may include a plurality of nonvolatile memory devices. The nonvolatile memory devices may be a nonvolatile memory device described with reference to FIGS. 1 to 14. Alternatively, the storage module 2400 may include a memory controller described with reference to FIGS. 1 to 14. For example, the storage module 2400 may operate based on an operation manner that has been described with reference to FIGS. 1 to 14.

The input interface 2500 may provide interfaces for receiving data or commands or for outputting data to an external device. For example, the input interface 2500 may be implemented with input devices, such as a camera, a touch screen, an operation recognition module, a microphone, and so on, or the input interface 2500 may be implemented with output devices, such as a display, a speaker, a touch screen, and so on.

Figure 17:
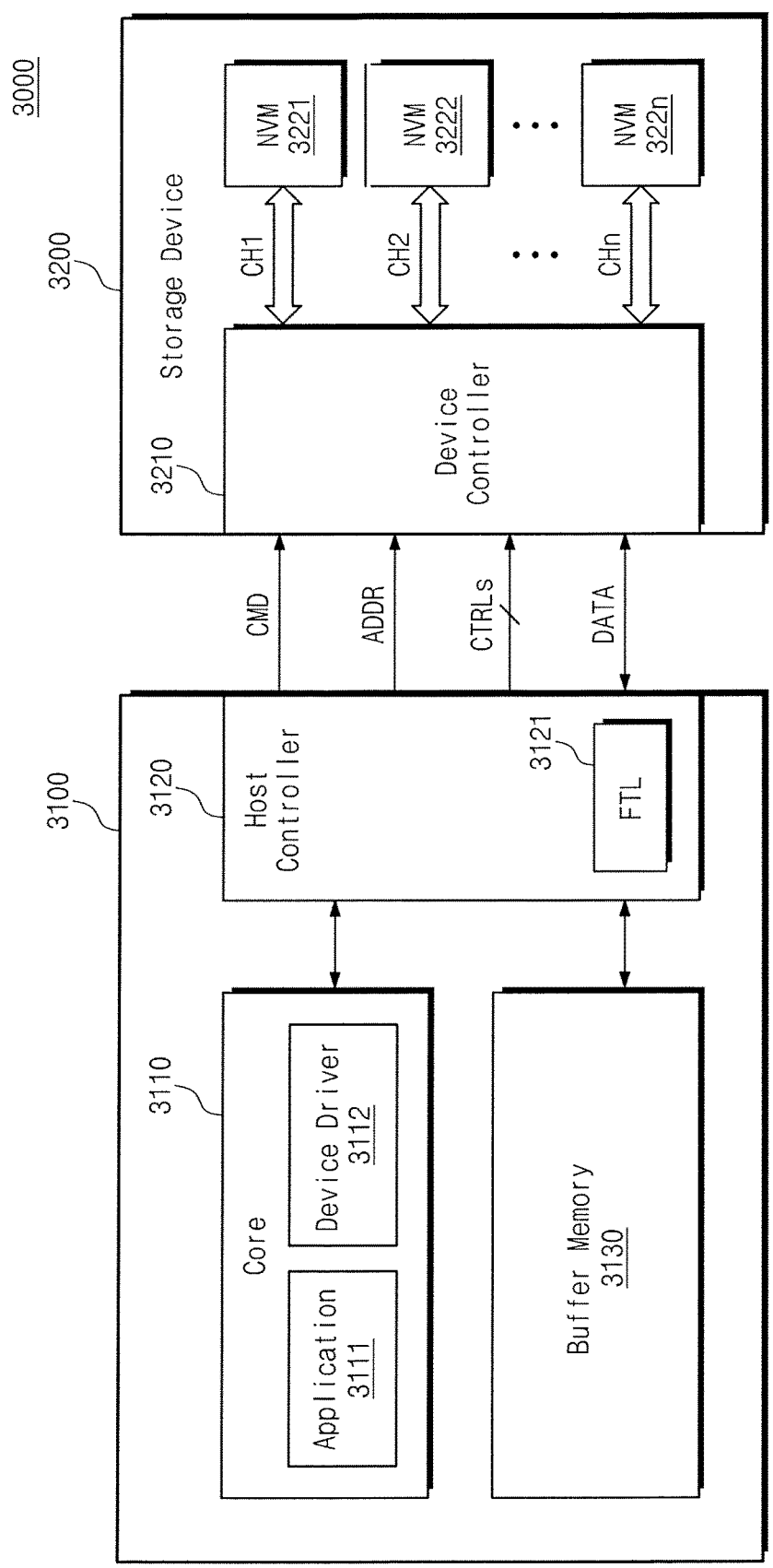
FIG. 17 is a block diagram schematically illustrating a user system according to an exemplary embodiment of the present inventive concept.

FIG. 17 is a block diagram schematically illustrating a user system according to an exemplary embodiment of the present inventive concept. Referring to FIG. 17, a user system 3000 includes a host 3100 and a storage device 3200. The host 3100 includes a core 3110, a host controller 3120, and a buffer memory 3130. The host 3100, for example, may be an application processor 2100 shown in FIG. 16. The host 3100 may be of a system-on-chip structure. Although not shown in figures, the host 3100 may be connected to separate external devices (e.g., network module, display, touch and panel) to exchange various signals therewith or process exchanged signals.

The core 3110 may control an overall operation of the host 3100. The core 3110 drives an application 3111 and a device driver 3112. The application 3111 may be formed of a variety of application programs that is to be executed by the host 3100. The device driver 3112 may be a device that is connected to the host 3100 and drives peripheral devices. For example, the device driver 3112 may drive the storage device 3200. The application 3111 or the device driver 3112 may be implemented by a software layer. The host controller 3120 sends a command CMD, an address ADDR, and control signals CTRLs to the storage device 3200. The host controller 3120 exchange data with the storage device 3200.

The buffer memory 3130 may be employed as a main memory or a cache memory of the host 3100. For example, the buffer memory 3130 may be used as a driving memory for driving software, such as the application 3111 or the device driver 3112, or firmware such as a flash translation layer 3121 of the host 3100.

The storage device 3200 stores or outputs data in response to a command CMD, an address ADDR, and control signals CTRLs from the host controller 3120. The storage device 3200 includes a device controller 3210 and nonvolatile memory devices 3221 to 322n. Signals are exchanged between the device controller 3210 and the nonvolatile memory devices 3221 to 322n via a plurality of channels CH1 to CHn. For example, the device controller 3210 processes (e.g., serializes or rearranges) data to be written in the nonvolatile memory devices 3221 to 322n and provides it to the nonvolatile memory devices 3221 to 322n or the host 3100.

In an exemplary embodiment of the present inventive concept, signals exchanged between the storage device 3200 and the host controller 3120 may be the same as those described with reference to FIGS. 1 to 16. For example, the host controller 3120 includes the flash translation layer 3121 that converts a logical address into a physical address ADDR and sends it to the storage device 3200.

In an exemplary embodiment of the present inventive concept, the device controller 3210 and the nonvolatile memory devices 3221 to 322n included in the storage device 3200 may be the same as those described with reference to FIGS. 1 to 16. For example, the device controller 3210 and the nonvolatile memory devices 3221 to 322n may operate based on an operation method, which has been described with reference to FIGS. 1 to 16.

An exemplary embodiment of the present inventive concept illustrated in FIGS. 1 to 16 has been described as a memory controller performs an address translating operation via the flash translation layer FTL. However, instead of the memory controller, the host 3100 (or, application processor or SoC) shown in FIG. 17 may perform an address translating operation. In an exemplary embodiment of the present inventive concept, an address translating operation of the device controller 3210 included in the storage device 3200 may be unnecessary. For this reason, the host 3100 and the storage device 3200 may communicate with each other based on an interface method between a memory controller and nonvolatile memory devices described with reference to FIGS. 1 to 16. The storage device 3200 may be, for example, an SD card, an MMC card, a USB flash memory driver, an eMMC, an error-free NAND flash memory, a manage NAND, a perfect page NAND (PPN), or an SSD (Solid State Driver).

In an exemplary embodiment of the present inventive concept, the device controller 3210 and the nonvolatile memory devices 3221 to 322n may communicate with each other based on an interface method between a memory controller and nonvolatile memory devices described with reference to FIGS. 1 to 16.

Although not shown in figures, the storage device 3200 may further comprise a separate storage circuit (e.g., an MRS, a fuse, or a register) for storing an operation mode information that is selected according to a mode control signal MODE (refer to FIG. 12).

With the above description, it is possible to decrease the number of signal pins between the device controller 3210 and the nonvolatile memory devices 3221 to 322n and the number of signal pins between the host 3100, supporting a NAND interface, and the storage device 3200, thereby reducing an area and a cost.

With the above-described embodiments of the present inventive concept, a memory controller transmits first to fourth control signals to a nonvolatile memory device. The nonvolatile memory device operates at a command state, an address state, a data input state, or a data output state based on the first to fourth control signals thus received. For example, the nonvolatile memory device may recognize a signal received via a data bus as a command, an address, or data, based on the first to fourth control signals. In the nonvolatile memory device, a signal received via the data bus may be provided to an address decoder, a control logic and voltage generator block, or a page buffer. Since the number of control signals, corresponding to e.g., the number of signal lines or signal pins of the nonvolatile memory device, decreases, a cost, an area, and power consumption may be reduced.

While the present inventive concept has been described with reference to exemplary embodiments, it will be apparent to those skilled in the art that various changes and modifications may be made without departing from the spirit and scope of the present inventive concept. Therefore, it should be understood that the above embodiments are not limiting, but illustrative.

What is claimed is:

1. A memory controller comprising:
    a first control pin and a second control pin configured to indicate one of an address state, a command state, or a data state of the memory controller;
    a plurality of data pins configured to transmit and receive a command signal, an address signal, and a data signal from/to a memory device; and
    a third control pin configured to transmit a data strobe signal to the memory device to indicate a timing to latch the address signal, the command signal, and the data signal,
    wherein all of the plurality of data pins are capable of transmitting and receiving any of the command signal, the address signal, and the data signal.

2. The memory controller of claim 1, wherein the first control pin transmits a command address enable signal to indicate that the command signal or the address signal is transmitted from the plurality of data pins.

3. The memory controller of claim 2, wherein the second control pin transmits a command address selection signal to indicate which of the address signal and the command signal is transmitted from the plurality of data pins.

4. The memory controller of claim 2, wherein the second control pin transmits a read enable signal that toggles when the memory controller receives the data signal from the plurality of data pins.

5. The memory controller of claim 4, wherein the memory controller receives the data signal synchronized with a data strobe signal received from the memory device.

6. A memory device comprising:
    a first control pin and a second control pin configured to indicate one of an address state, a command state, and a data state of the memory device;
    a plurality of data pins configured to transmit and receive a command signal, an address signal, and a data signal from/to the memory device; and
    a third control pin configured to transmit a data strobe signal to a memory controller to indicate a timing to latch the address signal, the command signal, and the data signal synchronized with the data strobe signal,
    wherein the address state, the command state, and the data state indicate whether the plurality of data pins transmits or receives the address signal, the command signal, and the data signal, respectively.

7. The memory device of claim 6, wherein the first control pin receives a command address enable signal to indicate that the command signal or the address signal is received from the plurality of data pins.

8. The memory device of claim 7, wherein the second control pin receives a command address selection signal to indicate which of the address signal and the command signal is received from the plurality of data pins.

9. The memory device of claim 7, wherein the second control pin receives a read enable signal that toggles when the memory device transmits the data signal from the plurality of data pins.

10. The memory device of claim 6, wherein the memory device latches the address signal, the command signal, and the data signal in response to at least one of a rising edge and a falling edge of the data strobe signal.

11. The memory device of claim 10, wherein the memory device operates in one of a reduced pin mode or a normal mode in response to a mode signal.

12. The memory device of claim 6, wherein the memory system is a phase-change random access memory (PRAM), a magnetic random access memory (MRAM), a resistive random access memory (RRAM), a NAND flash memory, or a NOR flash memory.

13. A memory system comprising:
    a memory controller; and
    a memory device connected to the memory controller through a control bus and a data bus,
    wherein the control bus transmits first and second control signals, and a data strobe signal from the memory controller to the memory device,
    wherein the first and second control signals together indicate one of an address state, a command state, and a data state of the memory system, and the data strobe signal indicates a timing to latch a data signal, and
    wherein the data bus transmits a command signal, an address signal, and the data signal synchronized with the data strobe signal between the memory controller and the memory device.

14. The memory system of claim 13, wherein the first control signal is a command address enable signal to indicate that the command signal or the address signal is received from the data bus.

15. The memory system of claim 14, wherein the second control signal is a command address selection signal to indicate which of the address signal and the command signal is received from the data bus.

16. The memory system of claim 13, wherein the second control signal is a read enable signal that toggles when the memory device transmits a data signal from the data bus.

17. The memory system of claim 16, wherein the memory device and the memory controller operate in one of a reduced pin mode or a normal mode in response to a mode signal.

18. The memory system of claim 13, wherein the memory device latches the address signal, the command signal, and the data signal in response to at least one of a rising edge and a falling edge of the data strobe signal.

19. The memory system of claim 13, wherein the data state includes a data input state where input data is received by the memory device and a data output state where output data is output from the memory device,
    wherein a first combination of levels of the first control signal, the second control signal, and the data strobe signal indicate the data input state, and
    wherein a second combination of levels of the first control signal, the second control signal, and the data strobe signal indicate the data output state.

20. The memory system of claim 13, wherein the memory system is a phase-change random access memory (PRAM), a magnetic random access memory (MRAM), a resistive random access memory (RRAM), a NAND flash memory, or a NOR flash memory.

* * * * *